United States Patent
Kim et al.

(10) Patent No.: US 8,354,670 B2
(45) Date of Patent: Jan. 15, 2013

(54) TRANSISTOR, METHOD OF MANUFACTURING TRANSISTOR, AND ELECTRONIC DEVICE INCLUDING TRANSISTOR

(75) Inventors: Sang-wook Kim, Yongin-si (KR); Sun-il Kim, Osan-si (KR); Chang-jung Kim, Yongin-si (KR); Jae-chul Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 79 days.

(21) Appl. No.: 12/801,531

(22) Filed: Jun. 14, 2010

(65) Prior Publication Data

US 2011/0147734 A1    Jun. 23, 2011

(30) Foreign Application Priority Data

Dec. 22, 2009   (KR) ................. 10-2009-0129127

(51) Int. Cl.
*H01L 29/786* (2006.01)
(52) U.S. Cl. .... 257/43; 257/613; 257/614; 257/E29.296
(58) Field of Classification Search .............. 257/43, 257/613, 614, E29.296
See application file for complete search history.

(56) References Cited

U.S. PATENT DOCUMENTS

| | | | |
|---|---|---|---|
| 7,355,202 B2 | 4/2008 | Zhang et al. | |
| 2008/0296568 A1 | 12/2008 | Ryu et al. | |
| 2009/0184315 A1* | 7/2009 | Lee et al. | 257/43 |
| 2009/0294764 A1 | 12/2009 | Kim et al. | |
| 2010/0224871 A1* | 9/2010 | Yamaguchi et al. | 257/43 |
| 2011/0175080 A1* | 7/2011 | Kim et al. | 257/43 |
| 2011/0253997 A1* | 10/2011 | Park et al. | 257/43 |
| 2012/0168757 A1* | 7/2012 | Park et al. | 257/59 |

FOREIGN PATENT DOCUMENTS

| | | |
|---|---|---|
| EP | 1 993 141 | 11/2008 |
| JP | 09-307116 | 11/1997 |
| JP | 2000-155342 | 6/2000 |
| JP | 2000-196099 | 7/2000 |
| JP | 2002-299614 | 10/2002 |
| JP | 2006-019609 | 1/2006 |
| KR | 1998-065168 | 10/1998 |
| KR | 10-2008-0095538 | 10/2008 |

OTHER PUBLICATIONS

European Search Report dated Sep. 20, 2010 for corresponding European Patent Application No. 10 16 7614.
European Examination Report dated Jul. 25, 2012 issued in Application No. 10167614.6.

* cited by examiner

*Primary Examiner* — Victor A Mandala
(74) *Attorney, Agent, or Firm* — Harness, Dickey & Pierce, P.L.C.

(57) ABSTRACT

Provided are a transistor, a method of manufacturing the transistor, and an electronic device including the transistor. The transistor may include a gate insulator of which at least one surface is treated with plasma. The surface of the gate insulator may be an interface that contacts a channel layer. The interface may be treated with plasma by using a fluorine (F)-containing gas, and thus may include fluorine (F). The interface treated with plasma may suppress the characteristic variations of the transistor due to light.

16 Claims, 9 Drawing Sheets

TRANSISTOR, METHOD OF MANUFACTURING TRANSISTOR, AND ELECTRONIC DEVICE INCLUDING TRANSISTOR

CROSS-REFERENCE TO RELATED APPLICATIONS

This application claims priority under U.S.C. §119 to Korean Patent Application No. 10-2009-0129127, filed on Dec. 22, 2009, in the Korean Intellectual Property Office (KIPO), the entire contents of which are incorporated herein by reference.

BACKGROUND

1. Field

Example embodiments relate to transistors, methods of manufacturing the transistors, and electronic devices including the transistors.

2. Description of the Related Art

Transistors are widely used as switching devices or driving devices in electronic devices. In particular, because thin film transistors may be formed on glass substrates or plastic substrates, they are generally used in the field of flat panel display devices, e.g., liquid crystal display (LCD) devices and organic light emitting display (OLED) devices.

A method of using an oxide layer having higher carrier mobility as a channel layer has been attempted to improve the operational characteristics of a transistor. This method is mostly applied to a thin film transistor for a flat panel display device. However, the characteristics of a transistor having an oxide layer as a channel layer may not be constantly maintained because the oxide layer is sensitive to light.

SUMMARY

Example embodiments provide transistors of which characteristic variations due to light are suppressed, methods of manufacturing the transistors, and electronic devices including the transistors. Additional aspects will be set forth in part in the description which follows and, in part, will be apparent from the description, or may be learned by practice of example embodiments.

According to example embodiments, a transistor may include a channel layer including an oxide semiconductor; a source and a drain that separately contact two ends of the channel layer, respectively; a gate corresponding to the channel layer; and a gate insulating layer between the channel layer and the gate, wherein a fluorine (F)-containing region is at an interface between the gate insulating layer and the channel layer.

The F-containing region may be a region treated with plasma containing F. The F-containing region may have a thickness of about 1 to about 100 Å. The oxide semiconductor may include a ZnO-based oxide. The ZnO-based oxide may include at least one selected from the group consisting of indium (In), gallium (Ga), aluminum (Al), titanium (Ti), tin (Sn), zirconium (Zr), hafnium (Hf), yttrium (Y), tantalum (Ta) and chromium (Cr).

The gate insulating layer may have a monolayer or multilayer structure including at least one of a silicon oxide layer and a silicon nitride layer. The gate may be disposed below or above the channel layer.

According to example embodiments, a flat display apparatus may include the transistor.

According to example embodiments, a method of manufacturing a transistor may include forming a gate; forming a gate insulting layer to cover the gate; plasma-treating a surface of the gate insulating layer; forming a channel layer including an oxide semiconductor on the gate insulating layer; and forming a source and a drain to separately contact two ends of the channel layer, respectively.

The processing may be performed using a fluorine (F)-containing gas. The processing may be performed using plasma-enhanced chemical vapor deposition (PECVD) equipment or reactive ion etching (RIE) equipment.

The plasma-treating using the PECVD equipment may be performed for about 1 to about 300 seconds at a temperature of about 20 to about 500° C. and a pressure of about 1 to about 1000 mTorr. The plasma-treating using the RIE equipment may be performed for about 1 to about 300 seconds at a temperature of about 20 to about 200° C. and a pressure of about 1 to about 500 mTorr.

The gate insulating layer may be formed to have a monolayer or multilayer structure including at least one of a silicon oxide layer and a silicon nitride layer. The oxide semiconductor may include a ZnO-based oxide. The ZnO-based oxide may include at least one selected from the group consisting of indium (In), gallium (Ga), aluminum (Al), titanium (Ti), tin (Sn), zirconium (Zr), hafnium (Hf), yttrium (Y), tantalum (Ta) and chromium (Cr).

According to example embodiments, a method of manufacturing a transistor may include forming a channel layer including an oxide semiconductor; forming a source and a drain to separately contact two ends of the channel layer, respectively; forming a first gate insulating layer covering the channel layer, the source, and the drain; plasma-treating the first gate insulating layer; forming a second gate insulating layer on the plasma-treated first gate insulating layer; and forming a gate on the second gate insulating layer.

The plasma-treated may be performed using a fluorine (F)-containing gas. The plasma-treated may be performed using plasma-enhanced chemical vapor deposition (PECVD) equipment or reactive ion etching (RIE) equipment. The first gate insulating layer may have a thickness of about 1 to about 100 Å.

The first gate insulating layer may include a silicon oxide. The second gate insulating layer may be formed to have a monolayer or multilayer structure including at least one of a silicon oxide layer and a silicon nitride layer. The oxide semiconductor may include a ZnO-based oxide.

The ZnO-based oxide may include at least one selected from the group consisting of indium (In), gallium (Ga), aluminum (Al), titanium (Ti), tin (Sn), zirconium (Zr), hafnium (Hf), yttrium (Y), tantalum (Ta) and chromium (Cr).

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
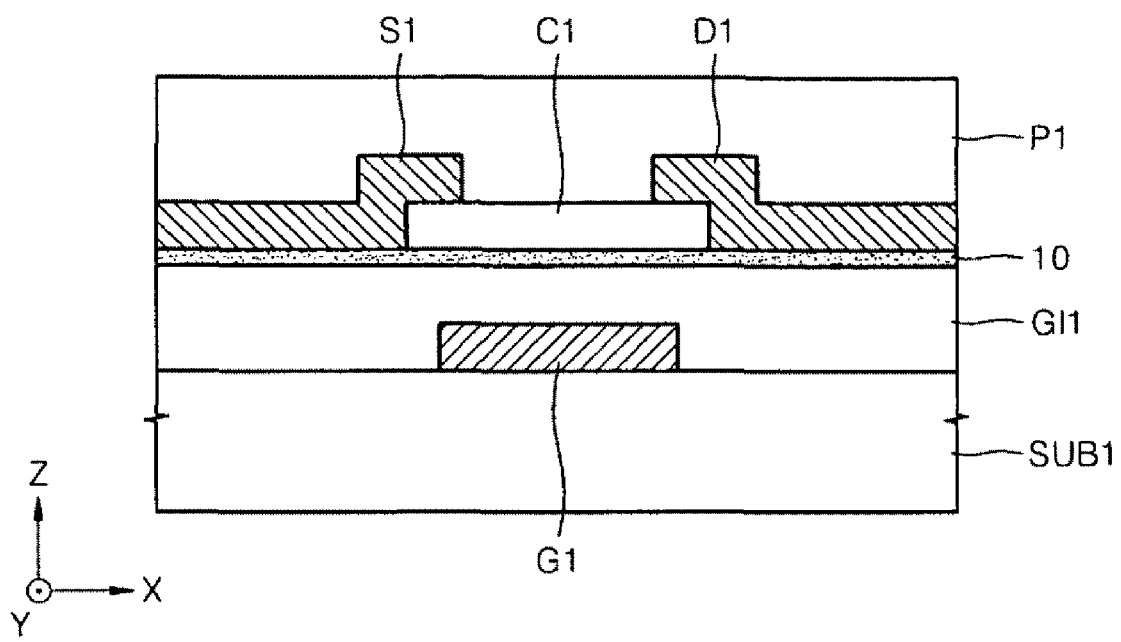
FIG. 1 is a cross-sectional diagram of a transistor according to example embodiments.

Various example embodiments will now be described more fully with reference to the accompanying drawings in which example embodiments are shown. Example embodiments may, however, be embodied in many different forms and should not be construed as being limited to example embodiments set forth herein; rather, these example embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

FIG. 1 is a cross-sectional diagram of a transistor according to example embodiments. The transistor according to example embodiments may be a bottom-gate thin film transistor in which a gate G1 is formed below a channel layer C1.

Referring to FIG. 1, the gate G1 may be formed on a substrate SUB1. The substrate SUB1 may be a glass substrate or other substrates used in a general semiconductor device process, for example, a plastic substrate or a silicon (Si) substrate. The gate G1 may be formed of a metal, e.g., Cu, Ti, Mo, Al, Ni, W, Pt and Cr, or a conductive oxide, e.g., an indium zinc oxide (IZO) and an indium tin oxide (ITO). The gate G1 may be configured as a multi-layered structure including a plurality of material layers formed of different materials, or may be formed of an alloy including two or more metals.

A gate insulating layer GI1 covering the gate G1 may be formed on the substrate SUB1. The gate insulating layer GI1 may include a Si oxide layer, a Si nitride layer, or another material layer, for example, a high-dielectric material layer having a higher dielectric constant than that of the Si nitride layer. In addition, the gate insulating layer GI1 may include a multi-layered structure including a plurality of material layers. For example, the gate insulating layer GI1 may include a multi-layered structure in which the Si nitride layer and the Si oxide layer are sequentially stacked.

A fluorine-containing region (F-containing region) 10 may be formed on an upper surface of the gate insulating layer GI1. The F-containing region 10 may be regarded as a portion of the gate insulating layer GI1. The F-containing region 10 contacts the channel layer C1 that will be described later. Thus, the F-containing region 10 may be disposed at an interface between the gate insulating layer GI1 and the channel layer C1. The F-containing region 10 may be a region treated with plasma including F. That is, the F-containing region 10 may be formed by treating a surface portion of the gate insulating layer GI1 with the plasma. The F-containing region 10 may have a thickness in the range of about 1 to about 100 Å.

The channel layer C1 may be disposed on the F-containing region 10. The channel layer C1 may be disposed above the gate G1 so as to correspond thereto. A width of the channel layer C1 may be greater than a width of the gate G1, wherein the widths are measured in an X-axis direction. The channel layer C1 may be formed of an oxide semiconductor, for example, a ZnO-based oxide semiconductor. In example embodiments, the ZnO-based oxide semiconductor may be a complex compound including at least one element selected from the group consisting of a Group III element, e.g., indium (In), gallium (Ga) and aluminum (Al), a Group IV element, e.g., titanium (Ti), tin (Sn), zirconium (Zr) and hafnium (Hf), and other elements, e.g., yttrium (Y), tantalum (Ta) and chromium (Cr). The oxide semiconductor may be an amorphous structure, a crystalline structure, or a combined structure of the amorphous structure and the crystalline structure.

When light is irradiated onto the channel layer C1, excess charges may be generated from the channel layer C1 and, thus the characteristics of the transistor may vary. The F-containing region 10 (for example, a region treated with plasma containing F) between the channel layer C1 and the gate insulating layer GI1 suppresses or prevents the characteristic variations of the transistor by preventing or reducing the formation of trap sites in which the excess charges, e.g., carriers, for example, electrons or holes, may be trapped. Fluorine (F) has higher electronegativity, thereby exhibiting cation-binding properties.

Thus, fluorine (F) atoms react with dangling bonds of a lower portion of the channel layer C1 so as to reduce the possibility that the channel layer C1 has defects. The dangling bond refers to an unpaired bond of an atom (metal or oxygen), which does not participate in a chemical bond, and may act as a defect. As the number of dangling bonds is reduced, less trap sites of the excess charges are formed. Thus, according to example embodiments, an oxide transistor of which characteristic variations due to light are suppressed may be embodied.

A source electrode S1 and a drain electrode D1 separately contacting two ends of the channel layer C1 may be disposed on the gate insulating layer GI1 including the F-containing region 10. The source electrode S1 and the drain electrode D1 may each be formed as a single metal layer or a multi-metal layer. The source electrode S1 and the drain electrode D1 may be formed of a metal, e.g., copper (Cu), titanium (Ti), molybdenum (Mo), aluminum (Al), nickel (Ni), tungsten (W), platinum (Pt) and chromium (Cr), or a conductive oxide, e.g., IZO and ITO. The source electrode S1 and the drain electrode D1 may be configured as a multi-layered structure including a plurality of material layers formed of different materials, or may be formed of an alloy including two or more metals.

The source electrode S1 and the drain electrode D1 may each be a material layer that is formed of the same material as or a different material from that of the gate G1. A passivation layer P1 may be formed to cover the channel layer C1, the source electrode S1, and the drain electrode D1. The passivation layer P1 may be formed to have a monolayer or multilayer structure including at least one of the group consisting of a Si oxide layer, a Si nitride layer, and an organic layer. The gate G1, the gate insulating layer GI1, the source electrode S1, and the drain electrode D1 may respectively have a thickness of about 50 to about 300 nm, about 50 to about 400 nm, about 10 to about 200 nm, and about 10 to about 200 nm.

Figure 2A:
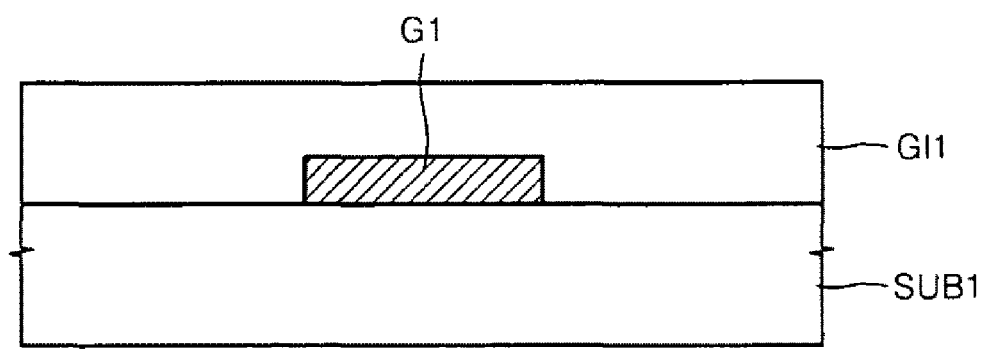
FIGS. 2A through 2E are cross-sectional views for explaining a method of manufacturing a transistor, according to example embodiments.

FIGS. 2A through 2E are cross-sectional views for explaining a method of manufacturing a transistor, according to example embodiments. Like reference numerals in FIG. 1 and FIGS. 2A through 2E denote like elements. Referring to FIG. 2A, a gate G1 may be formed on a substrate SUB1 by forming an electrode material for the gate G1 and patterning the electrode material. A gate insulating layer GI1 may be formed to cover the gate G1.

The gate insulating layer GI1 may include a Si oxide layer, a Si nitride layer, or another material layer, for example, a high-dielectric material layer having a higher dielectric constant than that of the Si nitride layer. In addition, the gate insulating layer GI1 may include a multi-layered structure including a plurality of material layers. For example, the gate insulating layer GI1 may include a multi-layered structure in which the Si nitride layer and the Si oxide layer are sequentially stacked.

Figure 2B:
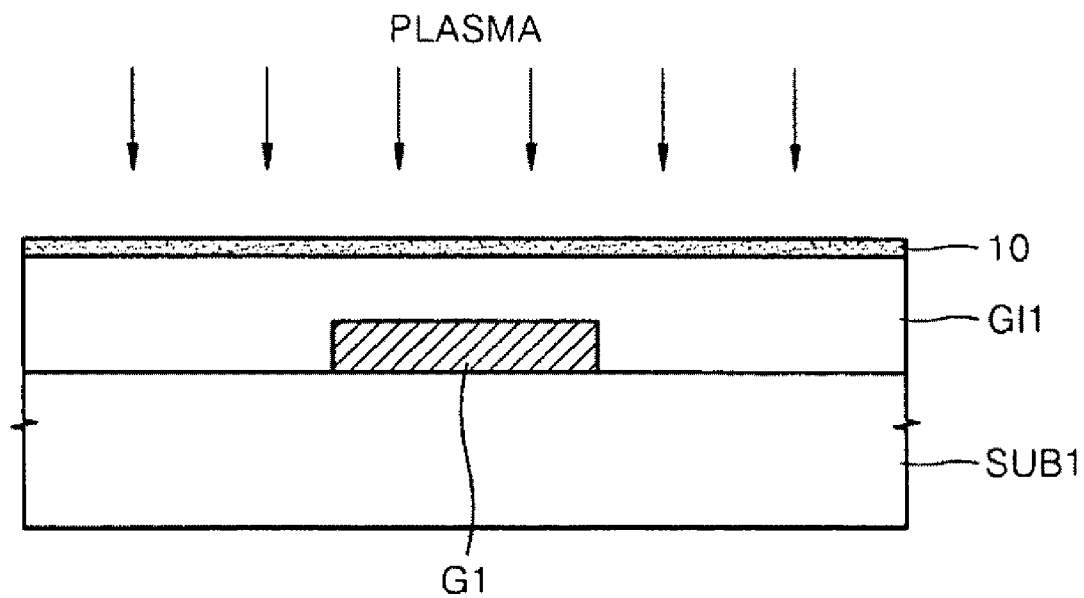

Referring to FIG. 2B, a surface portion of the gate insulating layer GI1 may be treated with plasma. In example embodiments, the plasma treating may be performed using a gas containing F. For example, the gas may include at least one of tetrafluoromethane ($CF_4$) and sulfur hexafluoride ($SF_6$). The plasma treating may be performed using plasma-enhanced chemical vapor deposition (PECVD) equipment, or reactive ion etching (RIE) equipment. By performing the plasma treating, a F-containing region 10 may be formed on the surface portion of the gate insulating layer GI1.

The F-containing region 10 may be a region doped with F elements. The F elements may be doped to a depth in the range of about 1 to about 100 Å. That is, the F-containing region 10 may have a thickness in the range of about 1 to about 100 Å. When the plasma treating is performed using the PECVD equipment, the plasma treating may be performed for about 1 to about 300 seconds at a temperature of about 20 to about 500° C. and a pressure of about 1 to about 1000 mTorr. When the plasma treating is performed using the RIE equipment, the plasma treating may be performed for about 1 to about 300 seconds at a temperature of about 20 to about 200° C. and a pressure of about 1 to about 500 mTorr.

Figure 2C:
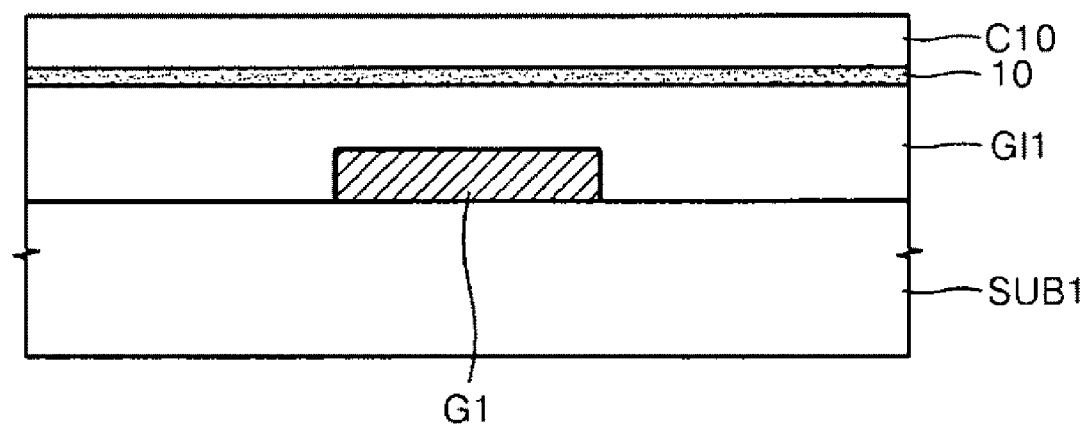

Referring to FIG. 2C, an oxide layer C10 for a channel may be formed on the gate insulating layer GI1. The oxide layer C10 may be formed using a physical vapor deposition method, e.g., a sputtering method and an evaporation method, or a chemical vapor deposition method. The oxide layer C10 may include, for example, a ZnO-based oxide semiconductor. In example embodiments, the ZnO-based oxide semiconductor may be a complex oxide including at least one element selected from the group consisting of a Group III element, e.g., indium (In), gallium (Ga) and aluminum (Al), a Group IV element, e.g., titanium (Ti), tin (Sn), zirconium (Zr) and hafnium (Hf), and other elements, e.g., yttrium (Y), tantalum (Ta) and chromium (Cr).

Figure 2D:
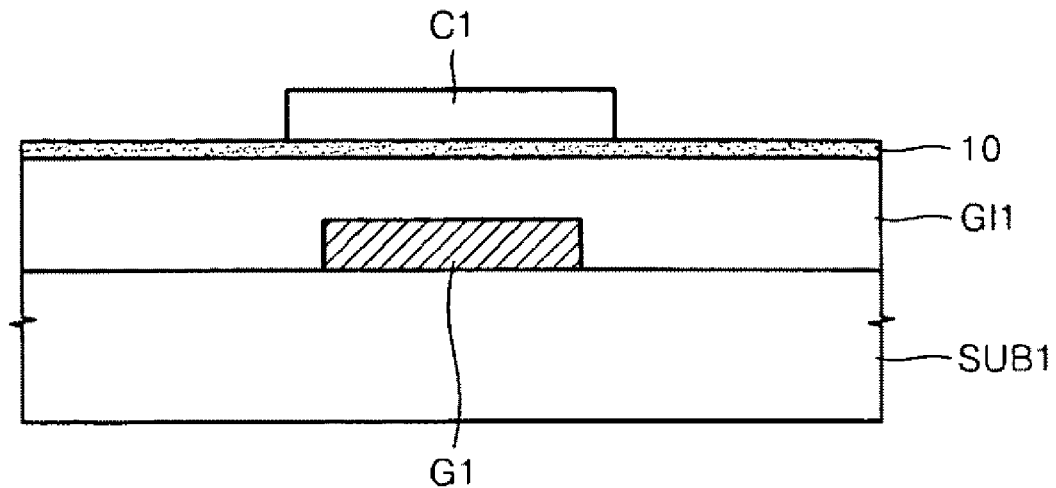

Referring to FIG. 2D, a channel layer C1 may be formed by patterning the oxide layer C10. The channel layer C1 may be disposed above the gate G1 so as to correspond thereto.

Figure 2E:
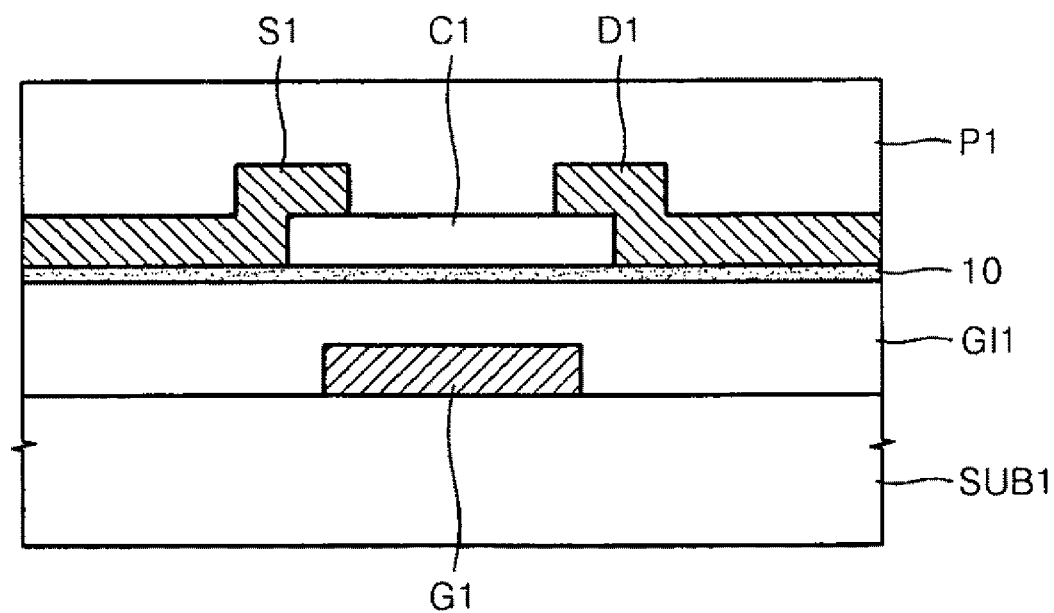

Referring to FIG. 2E, a source electrode S1 and a drain electrode D1 may be formed on the gate insulating layer GI1 including the F-containing region 10 to separately contact two ends of the channel layer C1, respectively. A portion of an upper surface of the channel layer C1 may be exposed between the source electrode S1 and the drain electrode D1. The source electrode S1 and the drain electrode D1 may be formed by forming an electrode material layer on the channel layer C1 and patterning the electrode material layer. The source electrode S1 and the drain electrode D1 may each be formed as a single metal layer or a multi-metal layer.

A passivation layer P1 may be formed on the substrate SUB1 to cover the exposed portion of the channel layer C1, the source electrode S1, and the drain electrode D1. The passivation layer P1 may be formed to have a monolayer or multilayer structure including at least one of the group consisting of a Si oxide layer, a Si nitride layer, and an organic layer. The transistor formed as described above may be annealed at a temperature of about 200 to about 400° C. By the annealing, the concentration of carriers in the channel layer C1 may be controlled, and defects of the channel layer C1 may be removed.

Hereinafter, an experimental example will be described. A bottom-gate transistor is manufactured under the following conditions.

Gate G1: Mo 2000Å
Gate insulating layer GI1: SiNx 2000Å/SiOx 500Å (PECVD)
Channel layer C1: HfInZnO 500Å
Source/drain electrodes S1 and D1: Mo 1000Å
Passivation layer P1: SiOx 2000Å

In order to form the gate insulating layer GI1, an SiNx layer and an SiOx layer were sequentially formed, and a surface portion of the SiOx layer was treated with plasma. The plasma treating was separately performed using the PECVD equipment and the RIE equipment. When the PECVD equipment was used, the plasma treating was performed using a $CF_4$ gas for about 10 seconds at a temperature of about 300° C. and a pressure of about 550 mTorr. When the RIE equipment was used, the plasma treating was performed using an $SF_6$ gas for about 30 seconds at room temperature and a pressure of about 150 mTorr. Transistors were manufactured by forming the channel layer C1, the source/drain electrode S1 and D1, and the passivation layer P1 on the gate insulating layer GI1 having a surface portion treated with plasma by using the above two ways.

Figure 5:
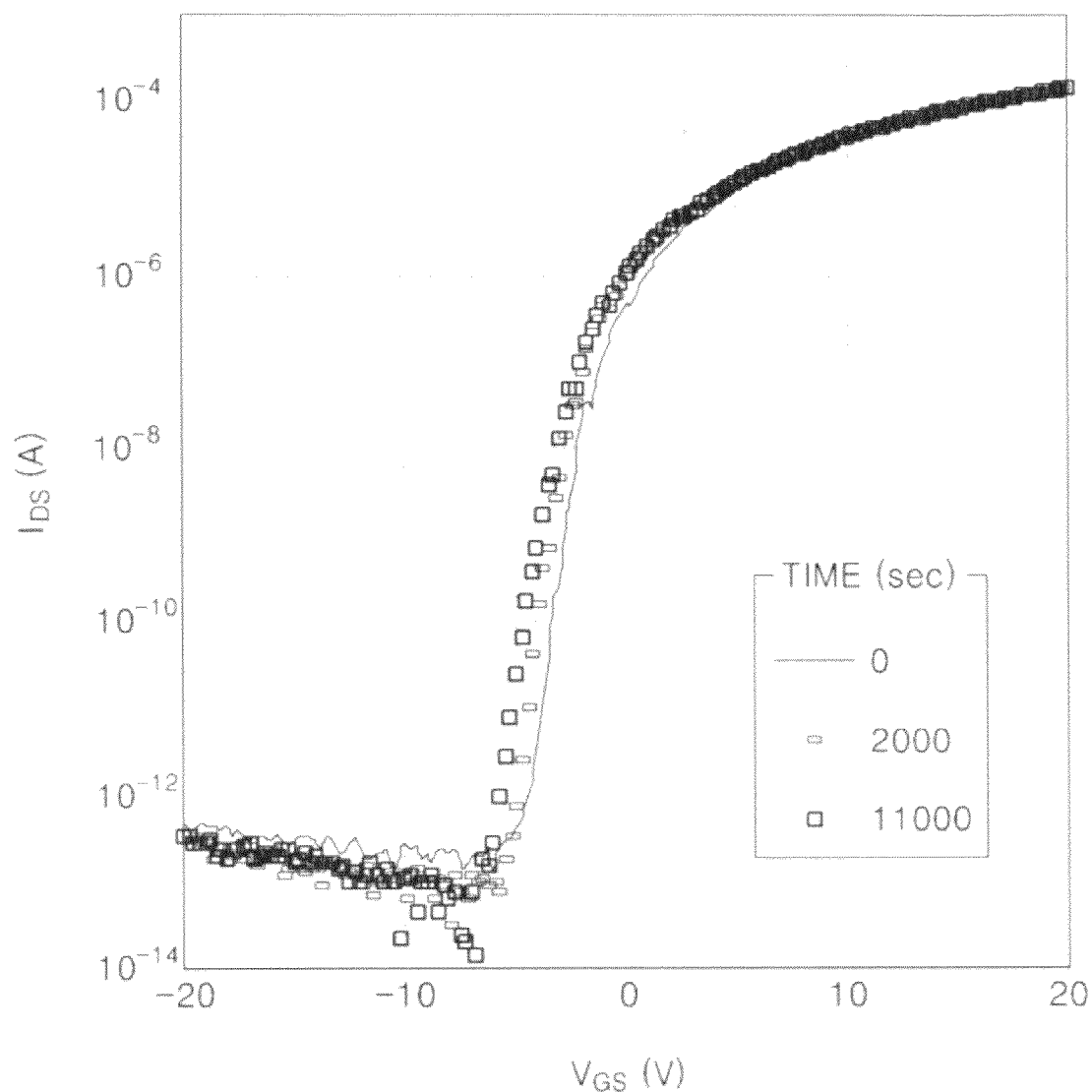
FIGS. 5 and 6 are graphs for evaluating the photoelectric reliabilities of the transistors according to example embodiments.
Figure 6:
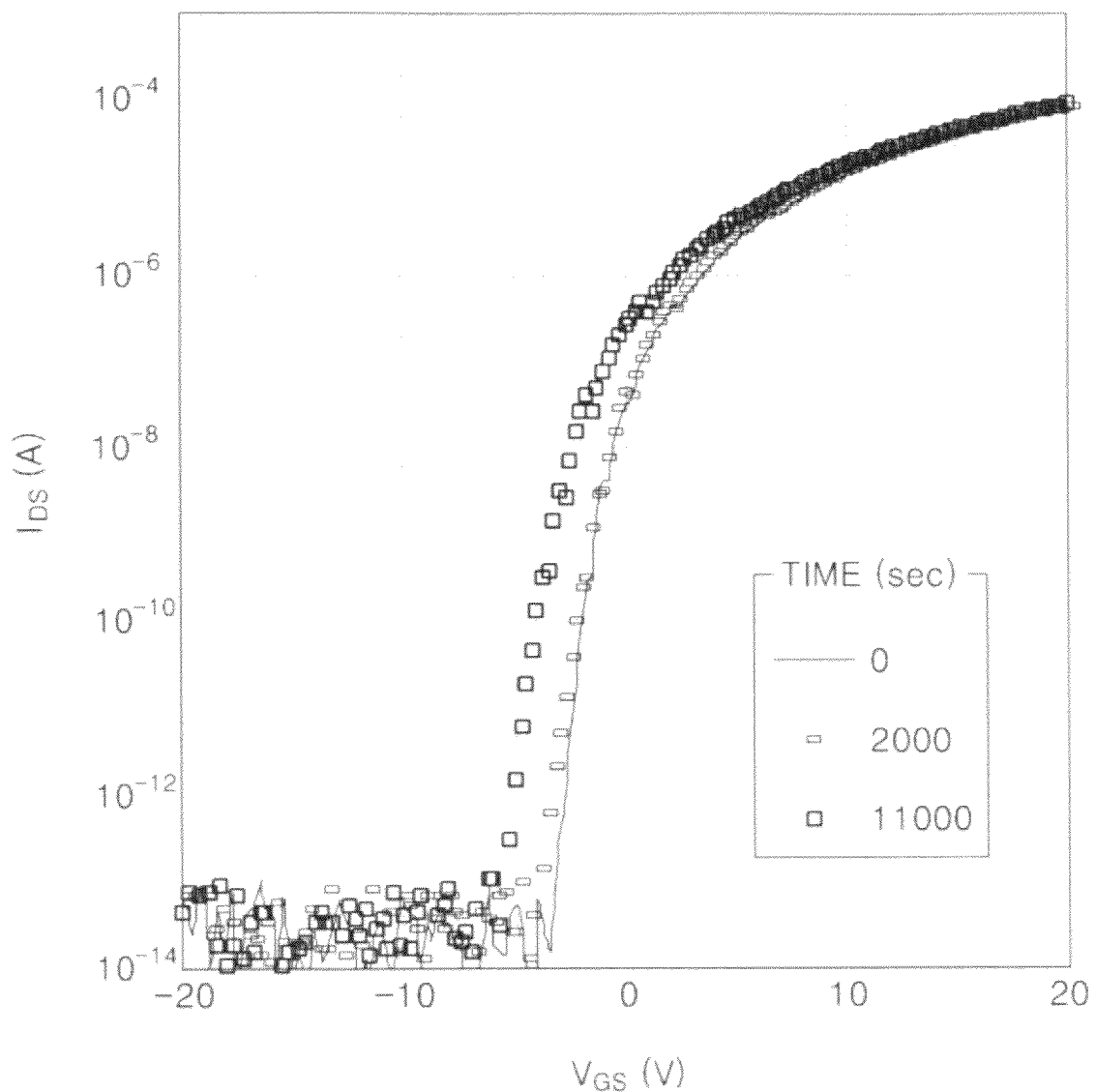

FIGS. 5 and 6 are graphs for evaluating the photoelectric reliabilities of the transistors manufactured in the Experimental Example, according to example embodiments. FIG. 5 is a graph related to the transistor manufactured by performing the plasma treating using the PECVD equipment. FIG. 6 is a graph related to the transistor manufactured by performing the plasma treating using the RIE equipment. The photoelectric reliabilities were evaluated by measuring variations in gate voltage $V_{GS}$-drain current $I_{DS}$ characteristics due to light irradiation and voltage stress. In more detail, the photoelectric reliabilities were measured by irradiating light of about 20,000 nit onto the transistors simultaneously, respectively applying voltages of −20V, 10V and 0V to a gate, a drain electrode, and a source electrode, and measuring variations in the gate voltage $V_{GS}$-drain current $I_{DS}$ characteristics of each transistor. In FIGS. 5 and 6, time (sec) refers to a time to apply a light-voltage stress. When the time is 0, no light-voltage stress is applied to the transistors. The photoelectric reliabilities of the transistors were performed at room temperature.

Figure 7:
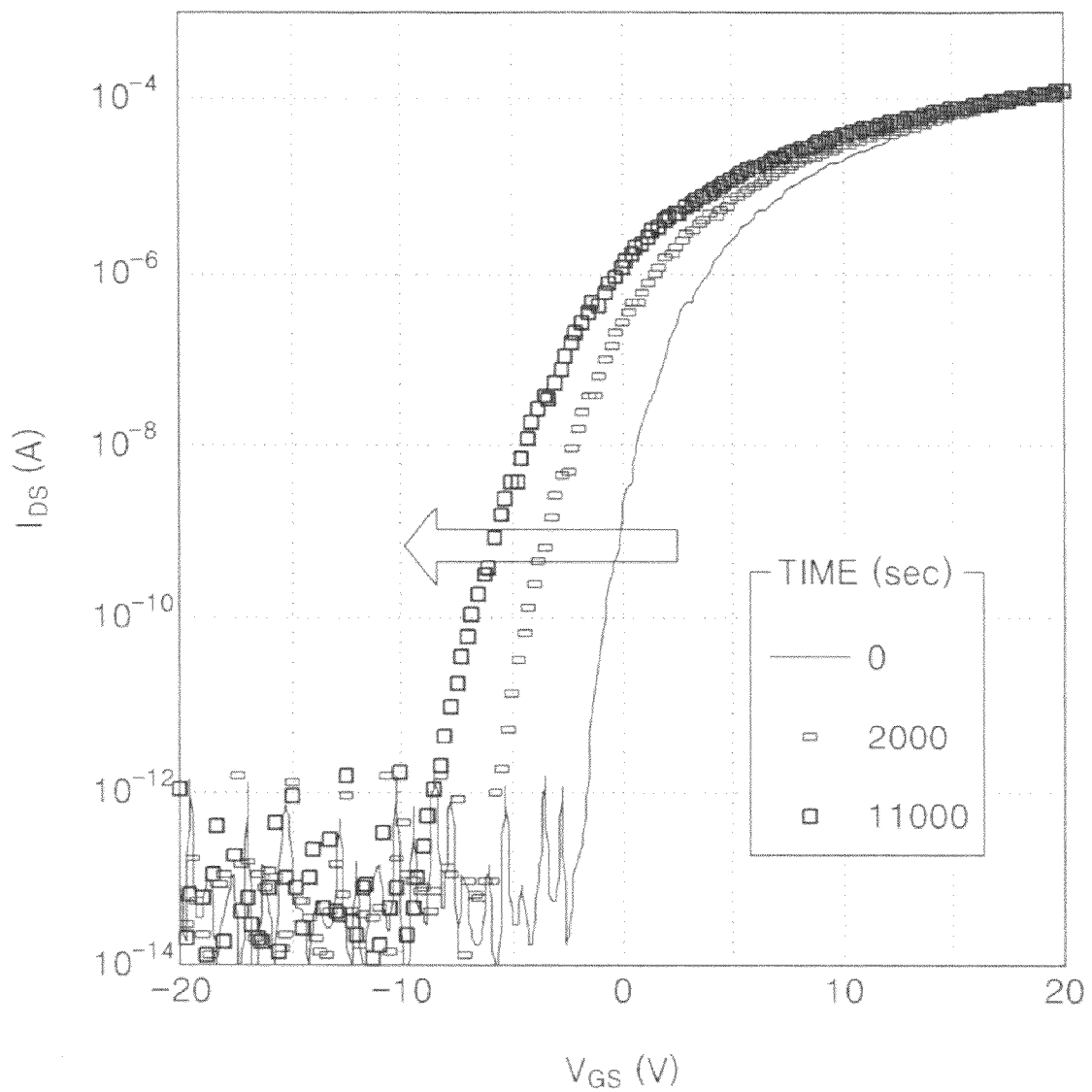
FIG. 7 is a graph for evaluating the photoelectric reliability of a transistor according to a comparative example.

FIG. 7 is a graph for evaluating the photoelectric reliability of a transistor manufactured in Comparative Example without plasma treating. The transistor manufactured in Comparative Example was manufactured in the same manner as the Experimental Example except that plasma treating was not performed. Conditions for evaluating the photoelectric reliability were the same as in the Experimental Example.

Referring to FIGS. 5 through 7, in the case of the transistor of FIG. 7, which is manufactured without plasma treating, as the light-voltage stress was further increased, a plot largely shifted to the left (a threshold voltage is reduced by about 4.5 V) from a plot of the transistor to which no light-voltage stress was applied. However, in the case of the transistors of FIGS. 5 and 6, which are manufactured with plasma treating, a plot slightly shifted from a plot of the transistor to which no light-voltage stress was applied, compared to the case of FIG. 7. This result shows that characteristic variations of the transistor due to light may be suppressed or prevented by forming an F-containing region at an interface between a gate insulating layer and a channel layer by performing plasma treating. Thus, according to example embodiments, an oxide transistor having improved photoelectric reliability may be embodied.

Figure 3:
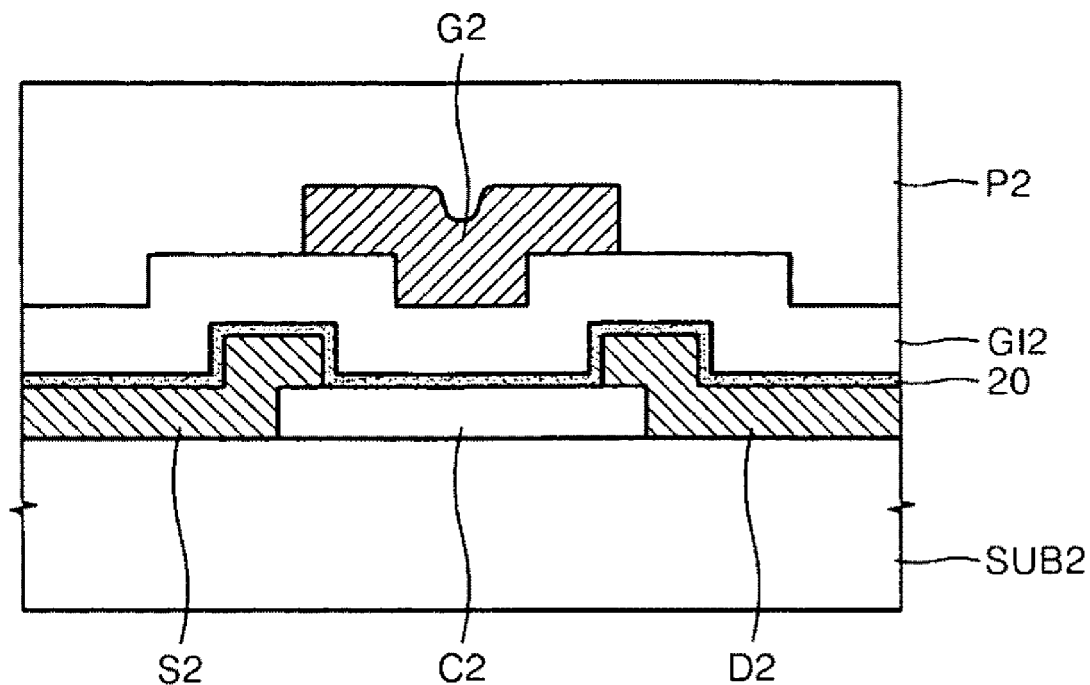
FIG. 3 is a cross-sectional view of a transistor according to example embodiments.

FIG. 3 is a cross-sectional view of a transistor according to example embodiments. The transistor according to example embodiments may be a top-gate thin film transistor in which a gate G2 is formed above a channel layer C2.

Referring to FIG. 3, the channel layer C2 may be formed on a substrate SUB2. A source electrode S2 and a drain electrode D2 may be disposed on the substrate SUB2 to separately contact two ends of the channel layer C2, respectively. An F-containing region 20 may be disposed to cover the channel layer C2, the source electrode S2, and the drain electrode D2. A gate insulating layer GI2 may be disposed on the F-containing region 20. The F-containing region 20 may be regarded as a portion of the gate insulating layer GI2. Thus, the F-containing region 20 may be disposed at an interface between the gate insulating layer GI2 and the channel layer C2.

The gate G2 may be disposed on the gate insulating layer GI2. The gate G2 may be disposed above the channel layer C2 so as to correspond thereto. A passivation layer P2 may be disposed on the gate insulating layer GI2 to cover the gate G2. The substrate SUB2, the channel layer C2, the source electrode S2, the drain electrode D2, the F-containing region 20, the gate insulating layer GI2, the gate G2 and the passivation layer P2 of FIG. 3 may have the same (or similar) materials and thicknesses as those of the substrate SUB1, the channel layer C1, the source electrode S1, the drain electrode D1, the F-containing region 10, the gate insulating layer GI1, the gate G1 and the passivation layer P1 of FIG. 1, respectively.

A combined structure of the F-containing region 20 and the gate insulating layer GI2 may be similar to an inversed structure of a combined structure of the F-containing region 10 and the gate insulating layer GI1 of FIG. 1. According to example embodiments, the F-containing region 20 may be treated with plasma including F, and the photoelectric reliability of the transistor may be improved.

Figure 4A:
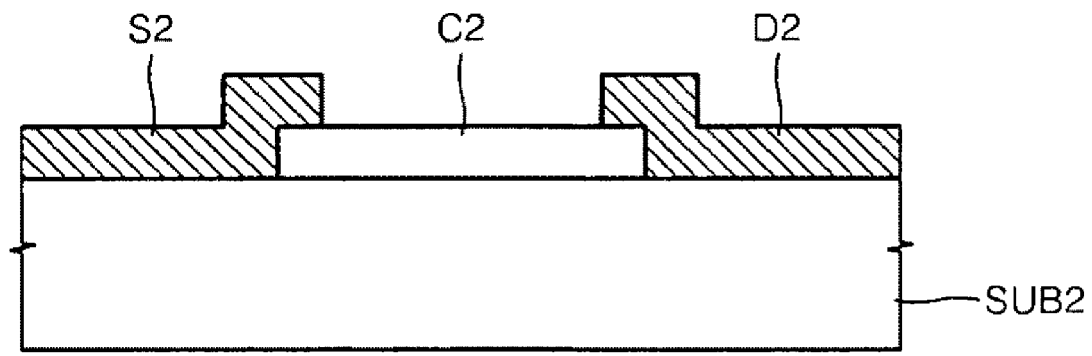
FIGS. 4A through 4E are cross-sectional views for explaining a method of manufacturing a transistor, according to example embodiments.

FIGS. 4A through 4E are cross-sectional views for explaining a method of manufacturing a transistor, according to example embodiments. Like reference numerals in FIG. 3 and FIGS. 4A through 4C denote like elements. Referring to FIG. 4A, a channel layer C2 may be formed on a substrate SUB2. The channel layer C2 may be formed of the same material as that of the channel layer C1 of FIG. 2D and may be formed using the same process as that of the channel layer C1 of FIG. 2D. A source electrode S2 and a drain electrode D2 may be formed on the substrate SUB2 to separately contact two ends of the channel layer C2, respectively.

Figure 4B:
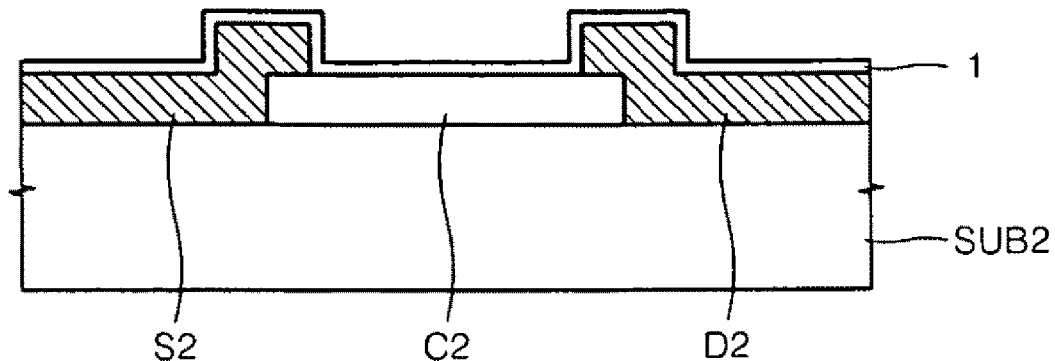

Referring to FIG. 4B, a first gate insulating layer 1 may be formed on the substrate SUB2 to cover an exposed portion of the channel layer C2, and the source electrode S2 and the drain electrode D2. The first gate insulating layer 1 may include a Si oxide layer, a Si nitride layer, or another material layer, for example, a high-dielectric material layer having a higher dielectric constant than that of the Si nitride layer. The first gate insulating layer 1 may have a thickness in the range of about 1 to about 100 Å.

Figure 4C:
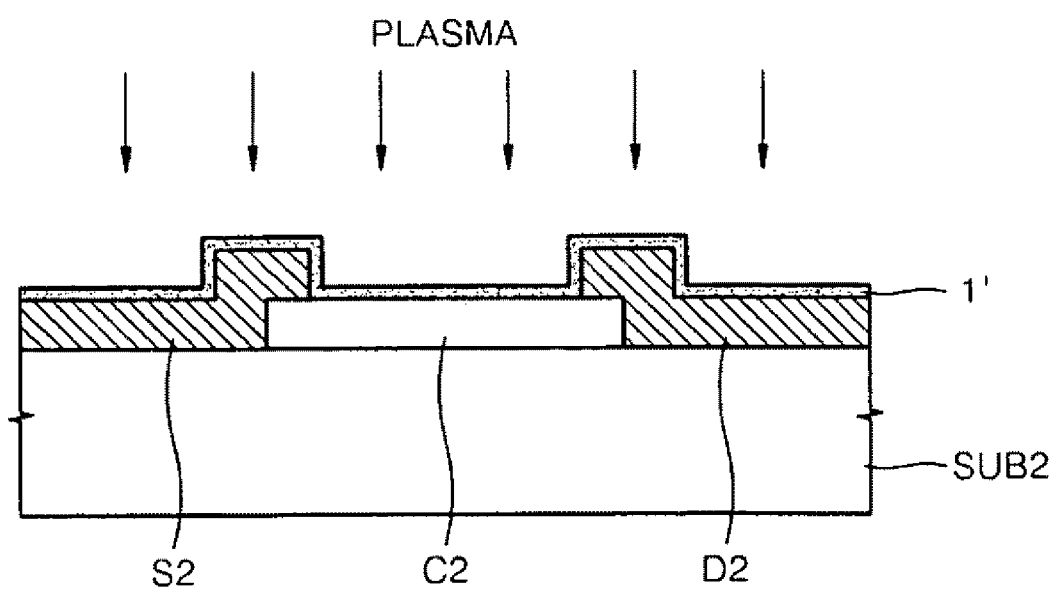

Referring to FIG. 4C, the first gate insulating layer 1 may be treated with plasma. A reference number 1' is used to represent the first gate insulating layer 1 after the first gate insulating layer 1 is treated with plasma. In example embodiments, the plasma treating may be performed using a gas containing F. For example, the gas may include at least one of $CF_4$ and $SF_6$. The plasma treating may be performed using plasma-enhanced chemical vapor deposition (PECVD) equipment, or reactive ion etching (RIE) equipment.

The conditions of the plasma treating according to example embodiments may be similar to the conditions described with reference to FIG. 2B. During the plasma treating, because the first gate insulating layer 1' is relatively thin, e.g., about 1 to about 100Å, F elements may reach an interface between the first gate insulating layer 1' and the channel layer C2. The first gate insulating layer 1' may correspond to the F-containing region 20 of FIG. 3. Hereinafter, the first gate insulating layer 1' will be referred to as the "F-containing region 1'".

Figure 4D:
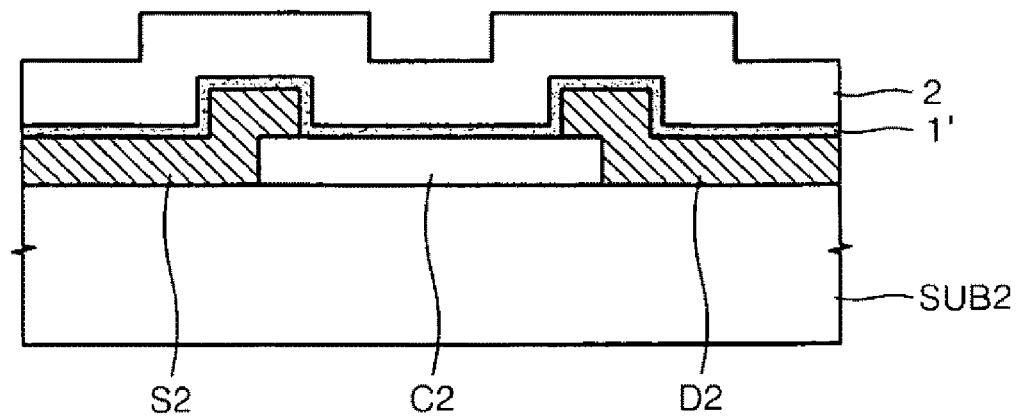

Referring to FIG. 4D, a second gate insulating layer 2 may be formed on the F-containing region 1'. The second gate insulating layer 2 may include a Si oxide layer, a Si nitride layer, or another material layer, for example, a high-dielectric material layer having a higher dielectric constant than that of the Si nitride layer. In addition, the second gate insulating layer 2 may include a multi-layered structure including a plurality of material layers. The second gate insulating layer 2 may correspond to the gate insulating layer GI2 of FIG. 3. Hereinafter, the second gate insulating layer 2 will be referred to as the "gate insulating layer 2".

Figure 4E:
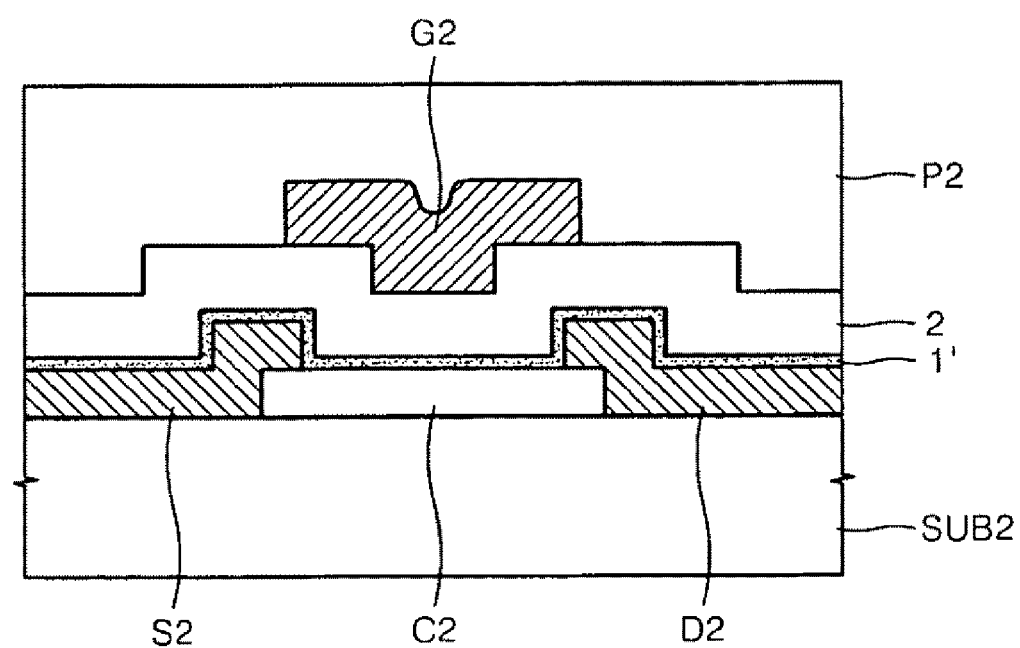

Referring to FIG. 4E, a gate G2 may be formed on the gate insulating layer 2. The gate G2 may be formed above the channel layer C2. A passivation layer P2 may be formed on the gate insulating layer 2 to cover the gate G2. The passivation layer P2 may be formed of the same material as that of the passivation layer P1 of FIG. 2E. The transistor formed as described above may be annealed at a given or predetermined temperature. Conditions for the annealing may be the same as conditions described with reference to FIG. 2E.

A transistor according to example embodiments may be used as a switching device or a driving device in flat panel display devices, e.g., liquid crystal display (LCD) devices and organic light emitting display (OLED) devices. As described above, the transistor according to example embodiments may have relatively small characteristic variations due to light, and thus, the reliability of a flat panel display device including the transistor may be improved. The structures of LCD devices and OLED devices are well known, and thus, detailed descriptions thereof will be omitted. The transistor according to example embodiments may be used for various purposes in other electronic devices, e.g., memory devices and logic devices, as well as flat panel display devices.

It should be understood that example embodiments described herein should be considered in a descriptive sense only and not for purposes of limitation. For example, it will be understood by one of ordinary skill in the art that the components and the structures of the transistors illustrated in FIGS. 1 and 3 may be modified and changed. The transistor according to example embodiments may have a double-gate structure, and the channel layer may have a multilayer structure. Also, the source/drain electrodes may contact a lower surface of the channel layer, not an upper surface thereof. In addition, it will be understood by one of ordinary skill in the art that the methods of FIGS. 2A through 2E and 4A through 4E may also be variously changed. Furthermore, descriptions of features or aspects within each example embodiment should typically be considered as available for other similar features or aspects in other example embodiments.

What is claimed is:

1. A transistor comprising:
    a channel layer including an oxide semiconductor;
    a source and a drain configured to separately contact two ends of the channel layer;
    a gate corresponding with the channel layer;
    a gate insulating layer between the channel layer and the gate; and
    a fluorine (F)-containing region between the gate insulating layer and the channel layer,
    wherein the gate insulating layer has a multilayer structure including a silicon nitride layer and a silicon oxide layer sequentially stacked.

2. The transistor of claim 1, wherein the F-containing region is a region treated with plasma containing F.

3. The transistor of claim 1, wherein the F-containing region has a thickness of about 1 to about 100 Å.

4. The transistor of claim 1, wherein the oxide semiconductor includes a ZnO-based oxide.

5. The transistor of claim 4, wherein the ZnO-based oxide includes at least one selected from the group consisting of indium (In), gallium (Ga), aluminum (Al), titanium (Ti), tin (Sn), zirconium (Zr), hafnium (Hf), yttrium (Y), tantalum (Ta) and chromium (Cr).

6. The transistor of claim 1, wherein the channel layer is on the gate.

7. The transistor of claim 1, wherein the gate is on the channel layer.

8. A flat panel display apparatus comprising the transistor of claim 1.

9. The transistor of claim 1, wherein the silicon nitride layer is between the silicon oxide layer and the gate.

10. A transistor comprising:
    a channel layer including an oxide semiconductor, the oxide semiconductor including hafnium indium zinc oxide (HfInZnO);
    a source and a drain configured to separately contact two ends of the channel layer;
    a gate corresponding with the channel layer;
    a gate insulating layer between the channel layer and the gate; and
    a fluorine (F)-containing region between the gate insulating layer and the channel layer.

11. The transistor of claim 10, wherein the F-containing region is a region treated with plasma containing F.

12. The transistor of claim 10, wherein the F-containing region has a thickness of about 1 to about 100 Å.

13. The transistor of claim 10, wherein the gate insulating layer has a monolayer or multilayer structure including at least one of a silicon oxide layer and a silicon nitride layer.

14. The transistor of claim 10, wherein the channel layer is on the gate.

15. The transistor of claim 10, wherein the gate is on the channel layer.

16. A flat panel display apparatus comprising the transistor of claim 10.

* * * * *